United States Patent [19]

Nakamura

[11] Patent Number: 4,841,609

[45] Date of Patent: Jun. 27, 1989

[54] A METHOD OF MANUFACTURING PIEZOELECTRIC VIBRATORS

[75] Inventor: Takeshi Nakamura, Uji, Japan

[73] Assignee: Murata Manufacturing Co., Ltd., Japan

[21] Appl. No.: 19,202

[22] Filed: Feb. 26, 1987

Related U.S. Application Data

[62] Division of Ser. No. 799,735, Nov. 19, 1985, abandoned.

[30] Foreign Application Priority Data

Nov. 29, 1984 [JP] Japan ............................. 59-253396

[51] Int. Cl.$^4$ ............................................ H01L 41/22
[52] U.S. Cl. ..................................... 29/25.35; 29/827; 29/847; 219/68
[58] Field of Search ..................... 29/25.35, 413, 414, 29/418, 827, 847; 445/5, 7; 338/195; 219/68

[56] References Cited

U.S. PATENT DOCUMENTS

| | | | |
|---|---|---|---|
| 3,290,757 | 12/1966 | Tanck | 219/68 X |
| 3,548,494 | 12/1970 | Haring | 219/68 X |
| 4,350,918 | 9/1982 | Sato | 310/344 X |
| 4,362,961 | 12/1982 | Gerber | 310/344 X |
| 4,405,875 | 9/1983 | Nagai | 310/348 X |
| 4,433,264 | 2/1984 | Nishiyama et al. | 310/321 |
| 4,469,975 | 9/1984 | Nakamura et al. | 310/321 |
| 4,486,681 | 12/1984 | Ishigami et al. | 310/353 |
| 4,511,821 | 4/1985 | Nakamura et al. | 310/344 X |
| 4,583,017 | 4/1986 | Nakamura et al. | 310/321 |

FOREIGN PATENT DOCUMENTS

| | | | |
|---|---|---|---|
| 0069913 | 6/1981 | Japan | 310/370 |
| 0087613 | 6/1982 | Japan | 310/348 |

Primary Examiner—Carl E. Hall
Attorney, Agent, or Firm—Wenderoth, Lind & Ponack

[57] ABSTRACT

A piezoelectric vibrator wafer which includes a plurality of vibrator chips each including a vibrator portion, a frame portion and connecting portions for connection between them, and joint portions for connecting the vibrator chips to each other, with the vibrator chips and joint portions being integrally formed in one unit by a metallic material to constitute the piezoelectric vibrator wafer. The joint portions each have such dimensions as will be readily fused upon passing of electric current through them. Invention by described.

2 Claims, 2 Drawing Sheets

A METHOD OF MANUFACTURING PIEZOELECTRIC VIBRATORS

This application is a division of now abandoned application Ser. No. 799,735, filed Nov. 19, 1985.

BACKGROUND OF THE INVENTION

The present invention generally relates to piezoelectric vibrators and more particularly, to a wafer of piezoelectric vibrators which is especially adapted for use in a novel method of manufacturing piezoelectric vibrators through employment of such a wafer of piezoelectric vibrators.

Conventionally, as a piezoelectric vibrator or resonator, there has been provided a vibrator which utilizes an expansion mode vibration of long sides or short sides of a piezoelectric vibrating portion formed into a rectangular shape. For one example of such a vibrator, there is shown in FIG. 1, a piezoelectric vibrator chip 1 employing the expansion mode vibration in the direction of its short sides, with the outer casing thereof omitted for brevity.

The above piezoelectric vibrator chip 1 includes a vibrator portion 2 constituted by a metallic material having a constant modulus of elasticity such as Elinvar or the like, a piezoelectric thin film 3 of ZnO, etc. formed on one surface of the vibrator portion 2 by sputtering, a vibrating electrode film 4 further formed on the surface of said piezoelectric thin film 3 through vacuum deposition, and a frame portion 6 connected to central portions of the short sides of said vibrator portion 2 by a pair of connecting portions 5, with said vibrating portion 2, connecting portions 5 and frame portion 6 being integrally formed as one unit.

The piezoelectric thin film 3 is further extended from the connecting portion 5 at one side towards one corner portion of the frame portion 6 as an extended piezoelectric thin film 3b, while on the surface of said extended piezoelectric thin film 3b, the vibrating electrode film 4 is similarly extended as an extended electrode film 4b. This extended electrode film 4b functions as a lead-out electrode, and thus, the extended piezoelectric thin film 3b has a function to electrically insulate the lead-out electrode 4b from the frame portion 6.

In the piezoelectric vibrator chip 1 having the construction as described so far, an external lead-out line 9 is connected to the lead-out electrode 4b, while another external lead-out line 10 is connected to the other corner portion of the frame portion 6.

As a vibrator in which the vibrator portion, frame portion and connecting portions for the connection therebetween are integrally formed by a metallic material as described above, there is also available an arrangement which employs, for example, a flexural mode vibration.

In the piezoelectric vibrators having the configuration as described so far, the vibrator chips thereof are not produced one piece by one piece, but are produced in one integral unit in which frames of a plurality of vibrator chips are connected to each other through more than one joint (such an integral unit is referred to as a piezoelectric vibrator wafer hereinafter), is prepared and the joints are removed after the wafer has been passed through predetermined processes to obtain individual vibrator chips. For removal of the joints, there may be used a scribing process employing a rotary blade, or another scribing process using laser. These processes, however, require an expensive facility and high accuracy for the positioning of workpieces at the cutting position, while moreover, it has been necessary to fix the piezoelectric vibrator wafer during cutting, thus presenting a bottleneck in continuous mass production. Furthermore, there are many problems to be solved such as removal of a fixing agent remaining adhered to the piezoelectric vibrator wafer, countermeasures against scattering of swarf during the cutting, removal of burrs, supplying of cooling or lubricating agents, etc., and these problems tend to be more difficult to solve as the objects to be dealt with become small in size.

SUMMARY OF THE INVENTION

Accordingly, an essential object of the present invention is to provide a piezoelectric vibrator wafer having a simple construction in which a plurality of vibrator chips are connected at frame portions thereof through joint portions into one integral unit, with the joint portions being readily removable to provide individual vibrator chips.

In accomplishing this and other objects, according to one aspect of the present invention, there is provided a piezoelectric vibrator wafer which comprises a plurality of vibrator chips each including a vibrator portion provided with a piezoelectric transducer, a frame portion surrounding the vibrator portion and connecting portions for connecting said vibrator portion and said frame portion, and joint portions for connecting said vibrator chips to each other, with said vibrator chips and said joint portions being integrally formed in one unit by a metallic material to constitute said piezoelectric vibrator wafer, and in which the joint portions are each provided with such dimensions as will be readily fused so as to be cut off upon passing electric current therethrough.

By the arrangement according to the present invention as described above, there has been provided an improved piezoelectric vibrator wafer which has a simple construction and which is usable in a method of manufacturing piezoelectric vibrators.

BRIEF DESCRIPTION OF THE DRAWINGS

This and other objects and features of the present invention will become apparent from the following description taken in conjunction with the accompanying drawings, in which.

DETAILED DESCRIPTION OF THE INVENTION

Figure 1:
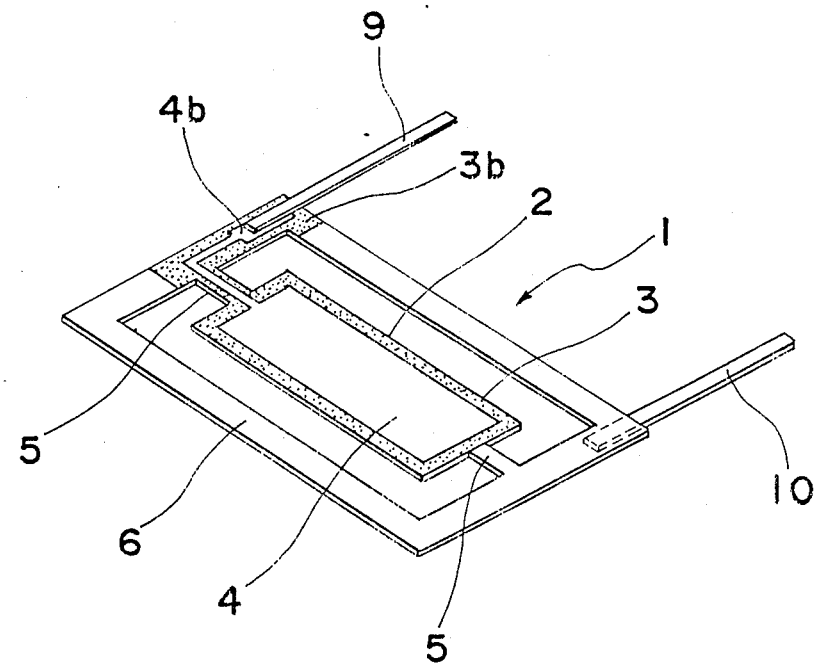
FIG. 1 is a perspective view of a piezoelectric vibrator to be formed from the wafer according to the present invention (already referred to)

Before the description of the present invention proceeds, it is to be noted that like parts are designated by like reference numerals throughout the accompanying drawings.

Figure 2:
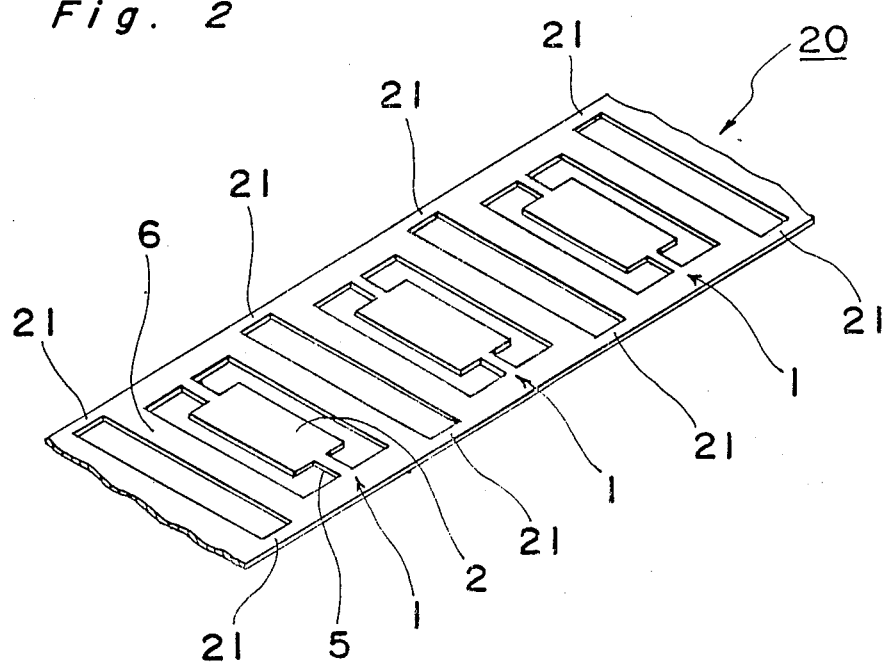
FIG. 2 is a fragmentary perspective view of a piezoelectric vibrator wafer according to one preferred embodiment of the present invention.

Referring now to the drawings, there is shown in FIG. 2 a piezoelectric vibrator wafer 20 according to one preferred embodiment of the present invention, which includes a plurality of vibrator chips 1 each including a vibrator portion 2 and a frame portion 6 and connecting portions 5 for connection therebetween, etc. as described with reference to FIG. 1 (the detailed description of each chip 1 is abbreviated here for brevity, with like parts being designated by like reference numerals), and joint portions 21 integrally formed with said frame portions 6 between opposite ends of the confronting two sides of said frame portions 6. It should be noted that in FIGS. 2 and 3, the piezoelectric thin film 3, vibrating electrode film 4, lead-out electrode 4b and piezoelectric thin film 3b, etc. described with reference to FIG. 1 are located on the reverse side of the wafer 20. In the above arrangement, each of the joint portions 21 should preferably be made as narrow as possible within a range in which mechanical strength can be maintained.

Subsequently, a method of removing the joint portions 21 will be explained hereinafter.

Figure 3:
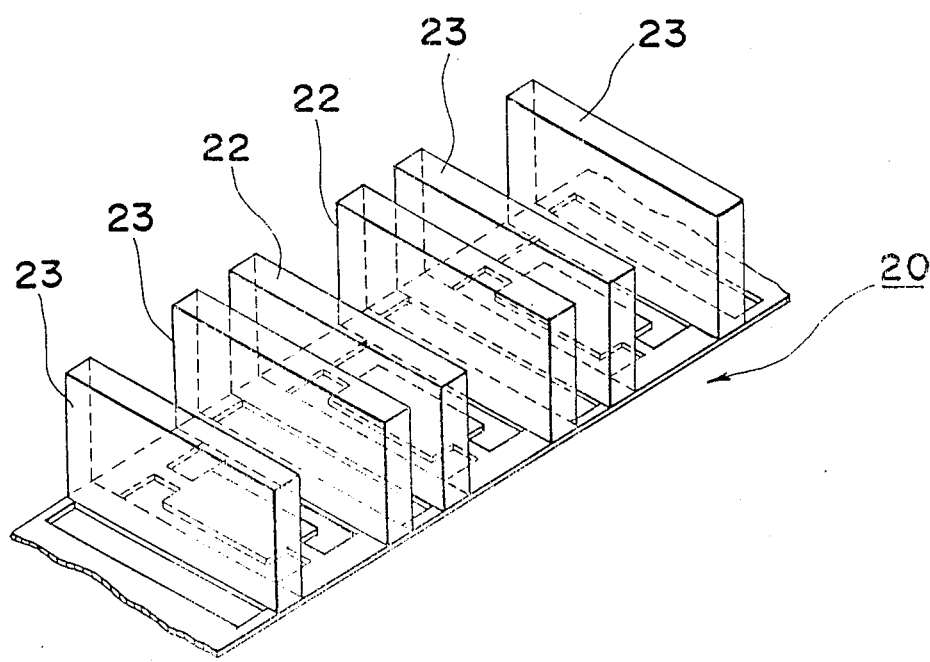
FIG. 3 is a view similar to FIG. 2 for particularly explaining a process of fusing and cutting off joint portions of the wafer in FIG. 2.

Referring also to FIG. 3, electrodes 22 and 23 are disposed, in a plurality of pairs depending on necessity, on opposite ends of the respective joint portions 21, i.e., on the confronting two sides of the frame portions 6 for contact therewith under pressure so as to allow electric current to flow through said joint portions 21. Thus, upon energization of the electrodes 22 and 23, resistance heat is generated in the joint portions 21 and they are fused and removed in an efficient manner.

It is to be noted here that the configuration of the electrodes 22 and 23 as illustrated in FIG. 3 is of a symbolic nature, and may, for example, be a shape such that they will contact under pressure the whole frame portion 6 or the entire vibrator chip 1.

It is also to be noted that the electric current may be either AC current or DC current, but AC current is preferable in the case where the metallic material forming the joint portions 21 is of a material which is easily magnetizable.

As is clear from the foregoing description, according to the present invention, favorable effects as follows may be achieved.

(i) Since the removal of the joint portions 21 by fusion is completed when electric current is stopped, it can be readily checked whether or not the joint portions have been completely removed.

(ii) Owing to the fact that the state of alignment of the respective piezoelectric vibrator chips is maintained even after separation by fusion, the chips may be easily transported to a subsequent step, thus making it possible to readily adopt automated processing.

(iii) Preparation of proper electrodes contacting the joint portions under pressure and a power source is sufficient for the processing, and thus, less cost is required for the installation than that in the conventional methods.

(iv) Rounded ends of joint portions 21 left after fusion, and avoidance of formation of burrs avoids obstruction during work such as insertion of the vibrator chip into an outer casing, etc., with a consequent favorable workability.

(v) Since electric current is stopped simultaneously upon separation by fusion, energy saving may be achieved as well as an increase in the processing speed.

(vi) The number of vibrator chips treated at one time may be increased because an increase in the number of electrodes contacting the frame portions under pressure can be easily accomplished, and thus, the method of using the wafer is very efficient in actual application.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing piezoelectric vibrators which comprises the steps of preparing a piezoelectric vibrator wafer which has a plurality of vibrator chips each including a vibrator portion provided with a piezoelectric transducer, a frame portion surrounding the vibrator portion and connecting portions for connecting said vibrator portion and said frame portion, and joint portions for connecting said vibrator chips to each other, with said vibrator chips and said joint portions being integrally formed in one unit by a metallic material to constitute said piezoelectric vibrator wafer, causing electric current to flow through said joint portions for separation of said vibrator chips so as to be individually transportable for further processing thereof, said step of causing electric current to flow through said joint portions for separation of said vibrator chips being performed by arranging a plurality of electrodes in pairs with said joint portions connecting an adjacent pair of said vibrator chips located therebetween; passing electric current through said electrodes and said joint portions and automatically terminating the flow of current through said electrodes when fusion of said joint portions in completed, said frame portion of each of said vibrator chips including opposite ends, said joint portion being integrally formed with and extending from said opposite ends, and each of said electrodes having a length sufficient to completely cover a respective one of said opposite ends, said electrodes being held under pressure so as to completely cover said opposite ends during said step of causing current to flow through said joint portions for separation of said vibrator chips.

2. A method of manufacturing piezoelectric vibrators which comprises the steps of preparing a piezoelectric vibrator wafer which has a plurality of vibrator chips each including a vibrator portion provided with a piezoelectric transducer, a frame portion surrounding the vibrator portion and connecting portions for connecting said vibrator portion and said frame portion, and joint portions for connecting said vibrator chips to each other, with said vibrator chips and said joint portions being integrally formed in one unit by a metallic material to constitute said piezoelectric vibrator wafer, causing electric current to flow through said joint portions for separation of said vibrator chips so as to be individually transportable for further processing thereof, said step of causing electric current to pass through said joint portions for separation of said vibrator chips being performed by arranging pairs of electrodes with said joint portions of an adjacent pair of said vibrator chips located therebetween, each of said electrodes being shaped to contact the entire frame portion of a respective one of said vibrator chips.

* * * * *